(12) United States Patent
Tredwell

(10) Patent No.: US 10,281,597 B2
(45) Date of Patent: May 7, 2019

(54) DETECTION OF X-RAY BEAM START AND STOP

(71) Applicant: CARESTREAM HEALTH, INC., Rochester, NY (US)

(72) Inventor: Timothy J. Tredwell, Fairport, NY (US)

(73) Assignee: Carestream Health, Inc., Rochester, NY (US)

(*) Notice: Subject to any disclaimer, the term of this patent is extended or adjusted under 35 U.S.C. 154(b) by 40 days.

(21) Appl. No.: 15/527,899

(22) PCT Filed: Dec. 15, 2015

(86) PCT No.: PCT/US2015/065708
§ 371 (c)(1),
(2) Date: May 18, 2017

(87) PCT Pub. No.: WO2016/100279
PCT Pub. Date: Jun. 23, 2016

(65) Prior Publication Data
US 2018/0341031 A1 Nov. 29, 2018

Related U.S. Application Data

(60) Provisional application No. 62/095,395, filed on Dec. 16, 2014.

(51) Int. Cl.
H04N 5/32 (2006.01)
H04N 5/3745 (2011.01)
G01T 1/24 (2006.01)
H01L 27/146 (2006.01)
H01L 31/0376 (2006.01)
H01L 31/115 (2006.01)
H01L 31/0216 (2014.01)
H01L 31/0224 (2006.01)

(52) U.S. Cl.
CPC .......... *G01T 1/241* (2013.01); *H01L 27/1463* (2013.01); *H01L 27/14603* (2013.01); *H01L 27/14605* (2013.01); *H01L 27/14609* (2013.01); *H01L 27/14612* (2013.01); *H01L 27/14636* (2013.01); *H01L 27/14663* (2013.01); *H01L 27/14692* (2013.01); *H01L 31/03762* (2013.01); *H01L 31/115* (2013.01); *H04N 5/32* (2013.01); *H04N 5/3745* (2013.01); *H01L 31/02161* (2013.01); *H01L 31/022466* (2013.01)

(58) Field of Classification Search
CPC ............... G01T 1/247; H01L 27/14612; H01L 27/14603; H01L 27/14609; H01L 27/14636; H01L 31/022466
See application file for complete search history.

(56) References Cited

U.S. PATENT DOCUMENTS

| | | | |
|---|---|---|---|
| 2012/0018641 A1 | 1/2012 | Watanabe et al. |
| 2013/0075620 A1 | 3/2013 | Nishino et al. |
| 2013/0228694 A1 | 9/2013 | Nakatsugawa et al. |

FOREIGN PATENT DOCUMENTS

| | | |
|---|---|---|
| CN | 102342839 | 2/2012 |
| CN | 103168252 | 6/2013 |

OTHER PUBLICATIONS

International Search Report dated Mar. 15, 2016 for International Patent Application No. PCT/US2015/065708, 2 pages.

*Primary Examiner* — David P Porta

(57) ABSTRACT

A radiographic energy detecting pixel generates charges in a photosensor in response to photon impacts. A switch electrically connected to the photosensor selectively transmits collected charges to a data line. A sensing circuit electrically connected to the photosensor detects a rate of accumulation of the charges in the photosensor.

8 Claims, 9 Drawing Sheets

DETECTION OF X-RAY BEAM START AND STOP

CROSS REFERENCE TO RELATED APPLICATIONS

This application claims the benefit of and is a U.S. National Phase filing of PCT Application PCT/US2015/065708 filed Dec. 15, 2015 entitled "MOBILE RADIOGRAPHIC IMAGING APPARATUS", in the name of Timothy J. Tredwell, which claims benefit of U.S. Provisional application U.S. Ser. No. 62/092,395, provisionally filed on Dec. 16, 2014, entitled "DETECTION OF X-RAY BEAM START AND STOP", in the name of Timothy J. Tredwell, all of which are incorporated herein in their entirety.

FIELD OF THE INVENTION

This disclosure relates to the field of radiographic imaging arrays in digital radiographic detectors (panels) and, in particular, the detector's configuration to sense the start and stop of X-ray exposure in the imaging array, and methods of operating the panel based on this information. This disclosure also relates to array circuits for independent sensing of the start and stop of X-ray exposure, signal processing of the sense signal to minimize false positives and false negatives, and methods of operation of the imaging array for sensing start of exposure, for signal integration during exposure, and for sensing end of exposure and subsequent readout.

BACKGROUND OF THE INVENTION

Stationary radiographic imaging equipment are employed in medical facilities (e.g., in a radiological department) to capture medical x-ray images on an x-ray detector. Mobile carts can also be used and include an x-ray source used to capture (e.g., digital) x-ray images on x-ray detectors. Such medical x-ray images can be captured using various techniques such as computed radiography (CR) and digital radiography (DR) in radiographic detectors. A related art digital radiography (DR) imaging panel acquires image data from a scintillating medium using an array of individual sensors, arranged in a row-by-column matrix, in which each sensor provides a single pixel of image data. Each pixel generally includes a photosensor and a switching element that can be arranged in a co-planar or a vertically integrated manner, as is generally known in the art. In these imaging devices, hydrogenated amorphous silicon (a-Si:H) is commonly used to form the photodiode and the thin-film transistor switch needed for each pixel. In one known imaging arrangement, a frontplane has an array of photosensitive elements and a backplane has an array of thin-film transistor (TFT) switches connected thereto.

FIG. 1 is a perspective view of a digital radiographic (DR) imaging system 10 that includes a generally planar DR detector 40 (shown without a housing for clarity of description), an x-ray source 14 configured to generate radiographic energy (x-ray radiation), and a digital monitor 26 configured to display images captured by the DR detector 40, according to one embodiment. The DR detector 40 may include a two dimensional array 12 of detector cells 22 (photosensors), arranged in electronically addressable rows and columns. The DR detector 40 may be positioned to receive x-rays 16 passing through a subject 20 during a radiographic energy exposure, or radiographic energy pulse, emitted by the x-ray source 14. As shown in FIG. 1, the radiographic imaging system 10 may use an x-ray source 14 that emits collimated x-rays 16, e.g. an x-ray beam, selectively aimed at and passing through a preselected region 18 of the subject 20. The x-ray beam 16 may be attenuated by varying degrees along its plurality of rays according to the internal structure of the subject 20, which attenuated rays are detected by the array 12 of photosensitive detector cells 22. The planar DR detector 40 is positioned, as much as possible, in a perpendicular relation to a substantially central ray 17 of the plurality of rays 16 emitted by the x-ray source 14. The array 12 of individual photosensitive cells (pixels) 22 may be electronically addressed (scanned) by their position according to column and row. As used herein, the terms "column" and "row" refer to the vertical and horizontal arrangement of the photosensor cells 22 and, for clarity of description, it will be assumed that the rows extend horizontally and the columns extend vertically. However, the orientation of the columns and rows is arbitrary and does not limit the scope of any embodiments disclosed herein. Furthermore, the term "subject" may be illustrated as a human patient in the description of FIG. 1, however, a subject of a DR imaging system, as the term is used herein, may be a human, an animal, an inanimate object, or a portion thereof.

In one exemplary embodiment, the rows of photosensitive cells 22 may be scanned one or more at a time by electronic scanning circuit 28 so that the exposure data from the array 12 may be transmitted to electronic read-out circuit 30. Each photosensitive cell 22 may independently store a charge proportional to an intensity, or energy level, of the attenuated radiographic radiation, or x-rays, received and absorbed in the cell. Thus, each photosensitive cell, when read-out, provides information defining a pixel of a radiographic image 24, e.g. a brightness level or an amount of energy absorbed by the pixel, that may be digitally decoded by image processing electronics 34 and transmitted to be displayed by the digital monitor 26 for viewing by a user. An electronic bias circuit 32 is electrically connected to the two-dimensional detector array 12 to provide a bias voltage to each of the photosensitive cells 22.

Each of the bias circuit 32, the scanning circuit 28, and the read-out circuit 30, may communicate with an acquisition control and image processing unit 34 over a connected cable (wired) 33, or the DR detector may be equipped with a wireless transmitter to transmit radiographic image data wirelessly 35 to the acquisition control and image processing unit 34. The acquisition control and image processing unit 34 may include a processor and electronic memory (not shown) to control operations of the DR detector 40 as described herein, including control of circuits 28, 30, and 32, for example, by use of programmed instructions. The acquisition control and image processing unit 34 may also be used to control activation of the x-ray source 14 during a radiographic exposure, controlling an x-ray tube electric current magnitude, and thus the fluence of x-rays in x-ray beam 16, and/or the x-ray tube voltage, and thus the energy level of the x-rays in x-ray beam 16.

The acquisition control and image processing unit 34 may transmit image (pixel) data to the monitor 26, based on the radiographic exposure data received from the array 12 of photosensitive cells 22. Alternatively, acquisition control and image processing unit 34 can process the image data and store it, or it may store raw unprocessed image data, in local or remotely accessible memory.

With regard to a direct detection embodiment of DR detector 40, the photosensitive cells 22 may each include a sensing element sensitive to x-rays, i.e. it absorbs x-rays and generates an amount of charge carriers in proportion to a magnitude of the absorbed x-ray energy. A switching element may be configured to be selectively activated to read out the charge level of a corresponding x-ray sensing element. With regard to an indirect detection embodiment of DR detector 40, photosensitive cells 22 may each include a sensing element sensitive to light rays in the visible spectrum, i.e. it absorbs light rays and generates an amount of charge carriers in proportion to a magnitude of the absorbed light energy, and a switching element that is selectively activated to read the charge level of the corresponding sensing element. A scintillator, or wavelength converter, is disposed over the light sensitive sensing elements to convert incident x-ray radiographic energy to visible light energy.

Examples of sensing elements used in sensing array 12 include various types of photoelectric conversion devices (e.g., photosensors) such as photodiodes (P-N or PIN diodes), photo-capacitors (MIS), photo-transistors or photoconductors. Examples of switching elements used for signal read-out include MOS transistors, bipolar transistors and other p-n junction components.

The standard exposure process for a DR detector system would comprise commanding the detector to enter a charge integration mode in which the photosensors are ready to receive a signal, then commanding the generator to prepare to fire for a known length of time and at a known X-ray flux, and, finally, under the command of the operator, generating an X-ray pulse. At the end of the X-ray exposure time, the detector and/or the acquisition control and image processing unit commands the detector to read out the image, using row by column readout electronics, from the photodiodes to electronic memory in the detector 40 or in the processing unit 34. The detector and/or the acquisition control and image processing unit may also command the detector to obtain one or more dark reference frames prior to or following the X-ray exposure for dark correction of the exposed image.

In many medical facilities, especially those with pre-existing X-ray generators, there is no pre-existing communication link between generator and detector. In many cases, these generators were intended for use with X-ray film or computed radiography phosphor plates. For these cases, or for convenience and reduction in wiring, it is desirable for the detector to be able to independently sense the start of X-ray exposure and enter a charge integration state as well as sense the end of exposure and enter a readout state.

A diagram of an exemplary pixel in a prior-art pixel passive array is shown in FIG. 2. The pixel 200 comprises a photo-diode 202 and a row-select thin-film transistor (TFT) 204. The anode 201 of the photodiode 202 is connected to a bias line 206 which supplies a constant bias voltage to the photodiode and the cathode 203 of the photodiode is connected to the drain of the row-select TFT 204. The gate of the row-select TFT is controlled by a gate line 208. The source of the TFT is connected to a data line 210.

A top view diagram of the layered layout of a pixel 300 is shown in FIG. 3 and a cross-section along A-A" of the pixel's layout 400 is shown in FIG. 4. The gate line metal 308 is deposited on the substrate 402 and patterned to form the gate line 308. The TFT 404 is formed by depositing and patterning in succession the gate dielectric 406, intrinsic and N+ amorphous silicon for the TFT channel 408, the source-drain metal to form TFT drain 410 and TFT source and data line 310, and a TFT passivation dielectric 414. The photodiode 302 is then formed by successive deposition and patterning of a cathode 203, followed by N+, intrinsic and P+ amorphous silicon layers, a transparent anode 201, a photodiode passivation dielectric 416, and a metal bias line 306.

A schematic of a photodiode array is shown in FIG. 5. In this prior-art array 500 the photo-sensing element is a PIN photodiode 502 and the switching device is a TFT 204 with source, gate and drain, as described above with reference to FIG. 2, although other photo-sensing elements and alternative switching elements may be employed. The gate lines 208 are oriented along the row direction and typically connects the gates of all the pixels in a row to a row address circuit 504. The row address circuit, which is positioned peripheral to the array, sequentially addresses each row, momentarily switching the TFT in the pixels along that row from an insulating (off) into a conducting (on) state. The source of the TFT is connected to a data line 210, which is oriented in the column direction of the array and is typically connected to all pixels in that column. The rows and columns may be referred to herein as comprising horizontal and vertical directions, respectively, which are arbitrary reference directions that are helpful for discussion purposes. Each data line is connected to a signal sensing circuit 506 peripheral to the array. In the circuit of FIG. 5, the signal sensing circuit comprises a charge amplifier 508 including an operational amplifier 510, a feedback capacitor 512, a reference voltage supply 514, and a feedback reset switch 516. The charge amplifier 508 senses the amount of charge required to reset the data line to the reference voltage by measuring the charge on the feedback amplifier 508.

In typical operation, the charge amplifiers 508 reset the cathodes of all photodiodes in the array to $V_{REF}$ by sequentially addressing each row of pixels. The timing sequence 600 is briefly described with reference to FIG. 6. The charge amplifier is illustrated in more detail in FIG. 7 and consists of a differential operational amplifier 710 with reference voltage 514 applied to the negative terminal 701 and signal input to the positive terminal 702. The input can be isolated from the charge amplifier by an isolation switch 704. A reset sample switch RSS 706, reset sample capacitor 708, a signal sample switch SSS 710, and signal sample capacitor 712 are illustrated connected to the output of operational amplifier 710. An integrator reset switch IRS 516 is provided between the input and output of the amplifier 710.

With respect to FIG. 6, at the start of a line time $T_L$, with the isolation switch 704 closed, the reset and signal sample capacitors 708, 712, are reset by closing the reset sample switch (RSS) 706, the signal sample switch (SSS) 710 and the integrator reset switch (IRS) 516. The reset signal charge level is then sampled by opening IRS 516 and SSS 710 while closing RSS 706. The analog signal processing following the charge amplifier can then sample the reset charge level at the output 718 of the charge amplifier 508. At the end of the reset sample, RSS 706 is opened and SSS 710 is closed. The gate line of the addressed row is then switched from $V_{OFF}$ to $V_{ON}$, transferring charge from the cathode of the diode in the addressed row to the signal sample capacitor 712. After a gate line on-time $T_{GL-ON}$ 602, the gate line is switched back from $V_{ON}$ to $V_{OFF}$. After the signal level has settled on the output 718 of the charge amplifier 508, the analog charge level on the output 718 of the charge amplifier 508 can be sampled by the analog signal processing, and the SSS 710 closes. The voltage difference between the signal and reset levels represents the signal charge divided by the feedback capacitance.

The dataline is reset to $V_{REF}$ by closing the feedback switch 516 of the charge amplifier 508. The timing is illustrated in FIG. 6. With the charge amplifier feedback switch 516 open, the row select circuit 504 addresses a gate line for switching a single gate line from $V_{OFF}$ to $V_{ON}$ for a time on-time $T_{GL\text{-}on}$ 602. While the TFT gate is on, the charge from the photodiode is transferred to the dataline. The charge amplifier 508 transfers that charge to the feedback capacitor 512 of the charge amplifier 508 for each dataline. The photodiode voltage is thus reset to $V_{BIAS}$-$V_{REF}$ (515, 514). The charge amplifier 508 completes the filtering and integration of the charge signal, then connects the output 718 of the charge amplifier 508 to the analog-to-digital converter. The feedback reset switch 516 is then closed, resetting the capacitor 512 and continuing to hold the data line at $V_{REF}$.

Prior to exposure by X-rays, the array is placed in integrate mode in which the gate lines of all the photodiodes are held at $V_{OFF}$ to isolate the diodes from the data line. In the presence of X-ray exposure, the photo-charge is stored on the photodiodes in addition to charge from the dark current of the photodiodes. Following exposure the charge in the array may be read out by sequentially addressing each of the rows, transferring the charge in the photodiodes in that row to the respective data lines, and sensing the charge in the charge amplifier 508 connected to each of the data lines. In typical operation, one or more unexposed frames would be captured either before and/or after exposure and digitally subtracted from the exposed frame.

The image sensor of FIG. 5 does not include circuitry to independently sense the start and end of X-ray exposure. For this sensor, the timing of the imaging array and the timing of the generator must be synchronized externally.

Several modifications to the image sensor design and operation have been proposed for systems in which the generator and the detector cannot be synchronized externally. These systems require X-ray beam sensing to determine the start of exposure so that the array may be placed into integrate mode. Examples of beam-sensing circuits include independent X-ray exposure sensing units integrated into the detector cassette below the detector, a detector with a circuit to sense a change in current in the bias supply for the photodiode bias voltage, sensors incorporating a sparse matrix of photodiodes inside the imaging array which are connected to a current-sensing circuit rather than the array readout electronics, etc.

The discussion above is merely provided for general background information and is not intended to be used as an aid in determining the scope of the claimed subject matter.

BRIEF DESCRIPTION OF THE INVENTION

Disclosed is a sense node capacitively coupled to the floating node of the photo-sensor that is sensed to determine the start, stop and temporal profile of the exposure of the sensor to X-rays. Several circuits are proposed for the sense node and sense electronics. The first of these comprises a sense electrode placed between the substrate and the cathode and routed to a sense amplifier. The second comprises a sense plane placed between the substrate and the cathode. The third utilizes the parasitic capacitance of the data line to the cathode with a sense node attached to the data lines either with a switch or with a capacitor.

In one embodiment, a sense electrode is fabricated as part of the imaging array in which the sense electrode is preferentially proximate the pixel electrodes as compared to being proximate the gate lines or the data lines. Because the sense electrode is capacitively coupled to the pixel electrodes, a change in voltage in the pixel electrodes due to either dark current or radiation exposure will result in charge induced onto the sense electrode. If the charge or current in the sense electrode is monitored prior to and during exposure, the beginning and the end of X-ray exposure can be sensed.

In one embodiment, a radiographic energy detecting pixel generates charges in a photosensor in response to photon impacts. A switch connected to the photosensor selectively transmits collected charges to a data line. A sensing circuit electrically connected to the photosensor detects a rate of accumulation of the charges in the photosensor.

In another embodiment, a radiographic detector includes a substrate, a plurality of dielectric layers over the substrate, and an array of photosensors over the dielectric layers for generating charges in response to photons impacting the photosensors. Each of the photosensors has an anode, a cathode, and a charge collecting layer therebetween. A data line is formed over the substrate substantially parallel to and adjacent to a first side of a first portion of the photosensors. A gate line is formed over the substrate and under one of the dielectric layers substantially parallel to a second side of a second portion of the photosensors and perpendicular to the data line. A switching device includes the gate line to electrically connect the cathode to the data line. A sense electrode formed over the substrate and under the photosensor is separated from the photosensor by one or more of the dielectric layers. The sense electrode is electrically linked to the photosensor by a capacitance.

The summary descriptions above are not meant to describe individual separate embodiments whose elements are not interchangeable. In fact, many of the elements described as related to a particular embodiment can be used together with, and possibly interchanged with, elements of other described embodiments. Many changes and modifications may be made within the scope of the present invention without departing from the spirit thereof, and the invention includes all such modifications. The drawings below are intended to be drawn neither to any precise scale with respect to relative size, angular relationship, relative position, or timing relationship, nor to any combinational relationship with respect to interchangeability, substitution, or representation of a required implementation.

This brief description of the invention is intended only to provide a brief overview of subject matter disclosed herein according to one or more illustrative embodiments, and does not serve as a guide to interpreting the claims or to define or limit the scope of the invention, which is defined only by the appended claims. This brief description is provided to introduce an illustrative selection of concepts in a simplified form that are further described below in the detailed description. This brief description is not intended to identify key features or essential features of the claimed subject matter, nor is it intended to be used as an aid in determining the scope of the claimed subject matter. The claimed subject matter is not limited to implementations that solve any or all disadvantages noted in the background.

BRIEF DESCRIPTION OF THE DRAWINGS

So that the manner in which the features of the invention can be understood, a detailed description of the invention may be had by reference to certain embodiments, some of which are illustrated in the accompanying drawings. It is to be noted, however, that the drawings illustrate only certain embodiments of this invention and are therefore not to be considered limiting of its scope, for the scope of the invention encompasses other equally effective embodiments. The drawings are not necessarily to scale, emphasis generally being placed upon illustrating the features of certain embodiments of the invention. In the drawings, like numerals are used to indicate like parts throughout the various views. Thus, for further understanding of the invention, reference can be made to the following detailed description, read in connection with the drawings in which.

DETAILED DESCRIPTION OF THE INVENTION

This application claims priority to U.S. Patent Application Ser. No. 62/092,395 filed Dec. 16, 2014, in the name of Tredwell, and entitled DETECTION OF X-RAY BEAM START AND STOP.

In an exemplary operation of a digital x-ray detector, the photodiode cathode is reset to the reference voltage $V_{REF}$ by turning on the row-select TFT switch in the pixel, after which the voltage is allowed to float when the TFT switch is turned off. During this period a small amount of charge accumulates on the photodiode due to thermal generation of carriers, or dark current. The increase in charge results in a decrease in cathode voltage given by:

$$dV_{CATH}/dt = I_{DARK}/C_{PD}$$

where $dV_{CATH}/dt$ is the rate of change of pixel electrode (photodiode cathode) voltage per unit time dt, $I_{DARK}$ is the photodiode dark current and $C_{PD}$ is the photodiode capacitance.

Figure 5:
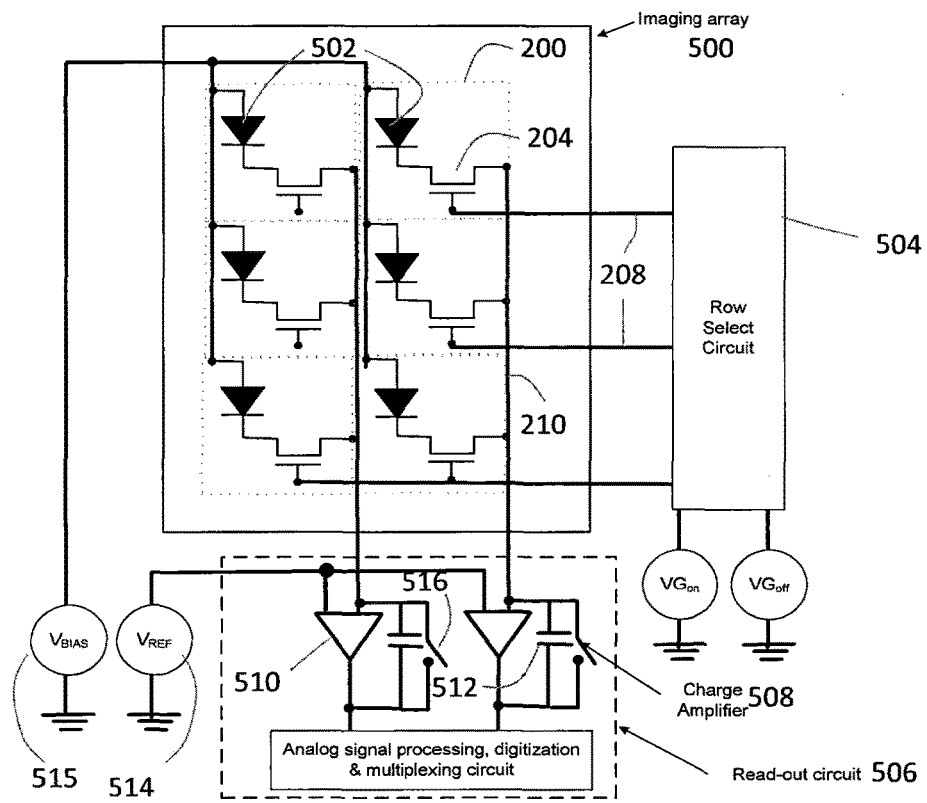
FIG. 5 is a diagram of an exemplary imaging array.

If the prior art array of FIG. 5 is exposed using X-rays, the scintillator converts the X-rays to photons, usually between 400 nm and 700 nm in wavelength. A portion of these photons are absorbed in the photodiode. The absorption of photons from the exposure in the photodiode results in charge $Q_{PD}$ on the photodiode in which the increase in charge is stored on the photodiode $dQ_{PD}$ with respect to time t. The rate of change of $dQ_{PD}$ is given by integrating the photon flux $\Phi_{PD}(\lambda)$ and the photodiode quantum efficiency $\eta_{PD}(\lambda)$ times the photodiode area $A_{PD}$ over wavelength $\lambda$:

$$I_\Phi(t) = dQ_{PD}/dt = \int \eta_{PD}(\lambda) \Phi_{PD}(\lambda,t) \times A_{PD} d\lambda$$

The wavelength dependence of the photon flux $\Phi_{PD}(\lambda)$ is determined by the emission properties of the scintillator which converts X-rays into visible light photons and is fixed for a given scintillator composition. The magnitude of the flux $\Phi_{PD}(\lambda,t)$ with time depends on a large number of factors, including the X-ray generator characteristics, the exposure time and the exposure value requested by the operator, the absorption in X-ray filters and the patient, and the conversion efficiency in photons per X-ray of the scintillator. Exposure times can vary from 10 ms in a pediatric exam in which patient movement is a concern to almost a second for low output generators for exams in which patient movement is not a major concern. Absorption in the patient can also vary by a factor of 1,000 or more from thick areas of dense bone to thin areas of soft tissue. Since the photodiode cathode is floating during exposure, the photodiode voltage, and thereby the voltage on the floating cathode, decreases by $$dV_{CATH}/dt = (I_\Phi(t) + I_{DARK})/C_{PD}$$

Figure 1:
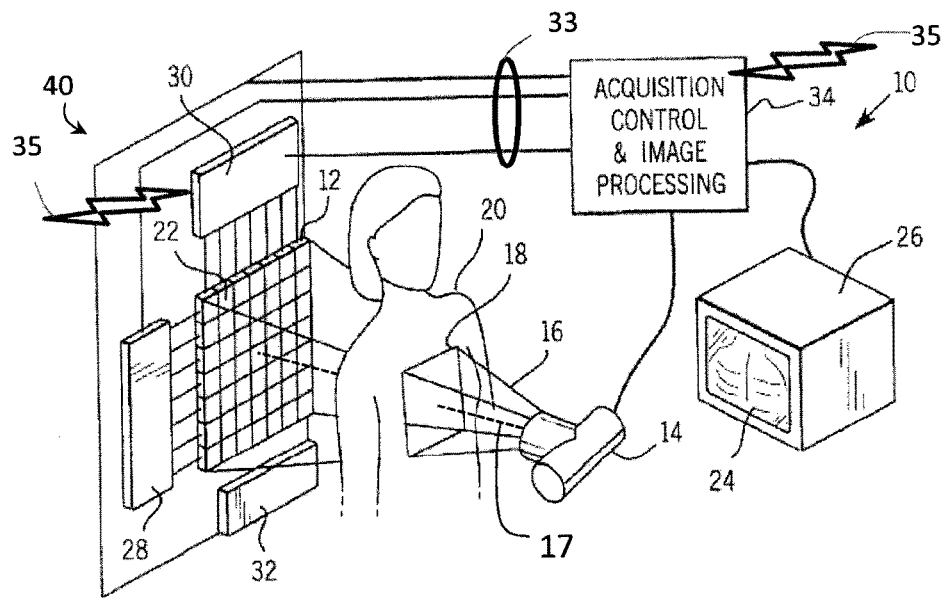
FIG. 1 illustrates an exemplary digital X-ray system in which the x-ray generator and detector are under the control of an acquisition control and image processing unit.
Figure 2:
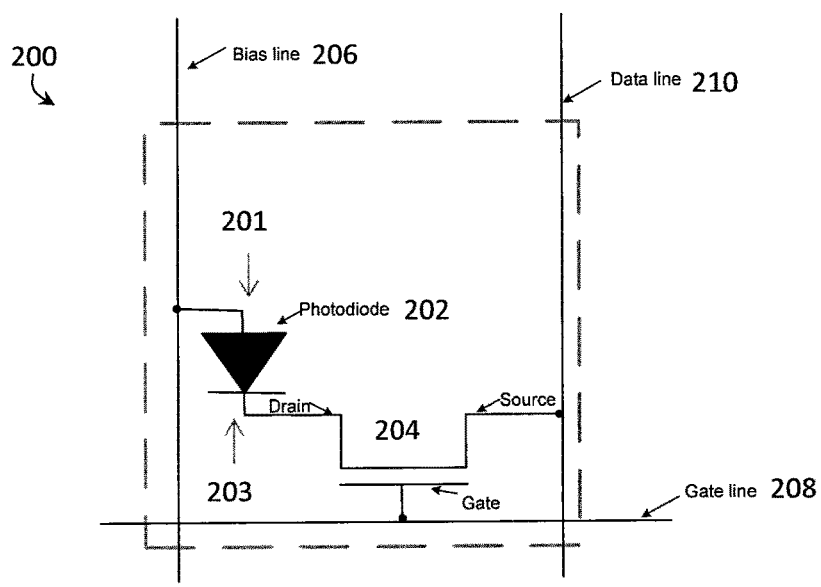
FIG. 2 is a diagram of an exemplary pixel of a prior art detector array.
Figure 3:
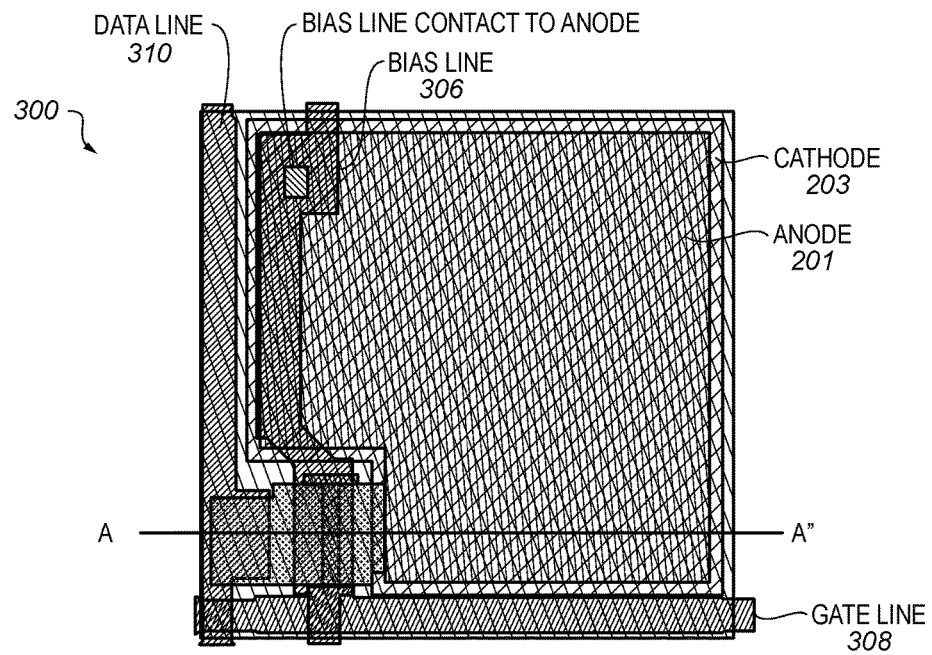
FIG. 3 illustrates an exemplary pixel layout of a prior art detector array.
Figure 4:
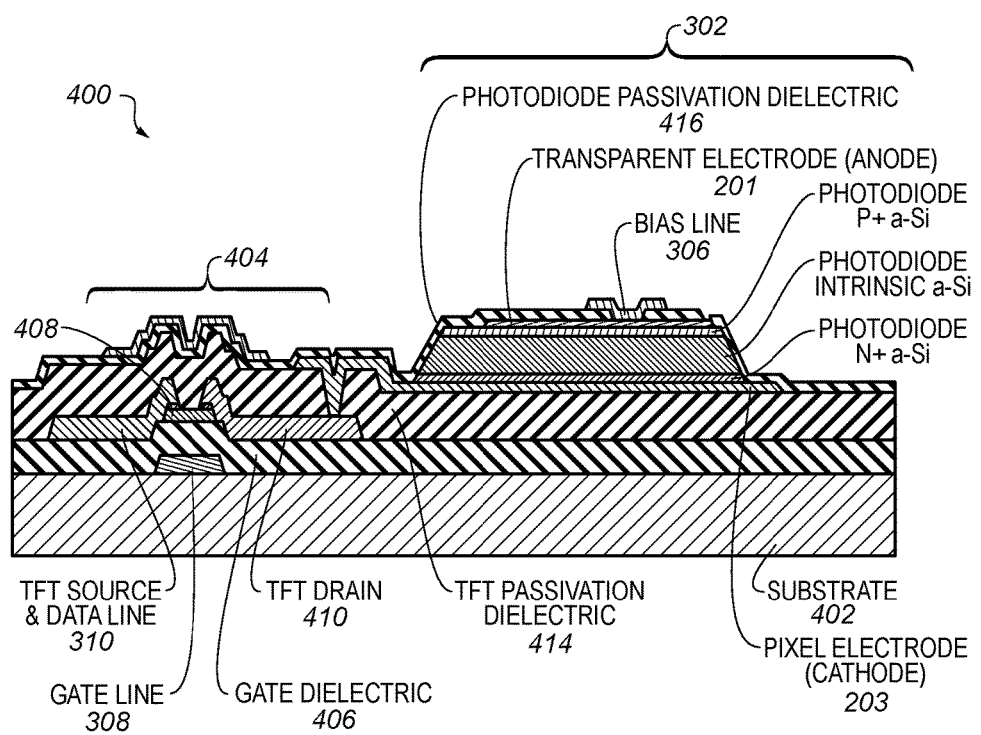
FIG. 4 is a cross-section of the pixel of FIG. 3 along section line A-A".
Figure 8:
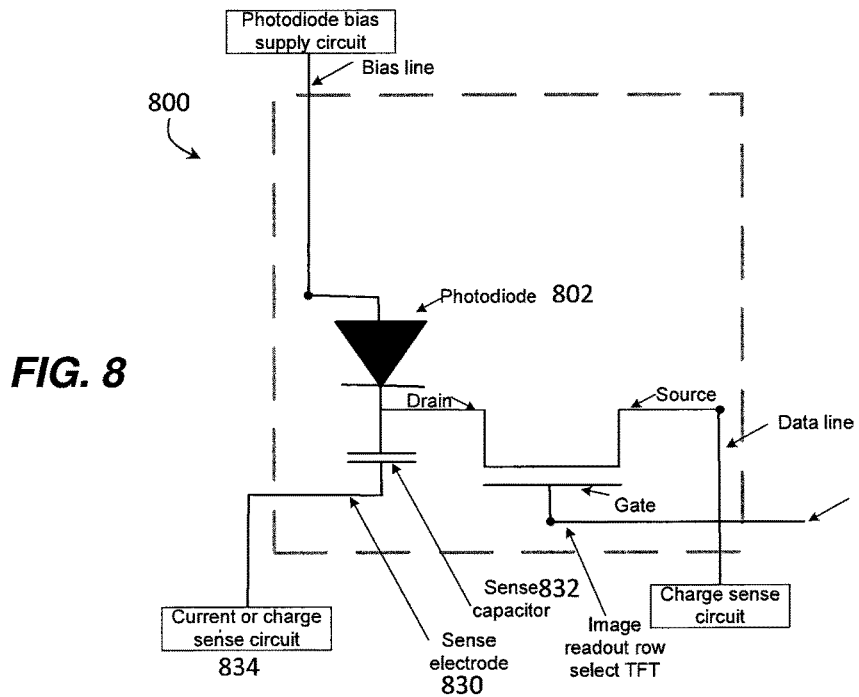
FIG. 8 illustrates an exemplary pixel with a capacitor between the photodiode cathode and a sense electrode connected to a current sense or charge sense circuit.

FIG. 8 shows one embodiment of a pixel 800 in a detector array similar to FIG. 2, but in which a sense electrode 830 is coupled to the cathode of the photodiode 802 through a sense capacitor $C_S$ 832 in the pixel 800. The sense electrode is attached to a current sense or charge sense circuit 834. Examples of sense circuits include a charge amplifier or a trans-impedance amplifier, both of which hold the voltage of the sense circuit to a reference voltage $V_{REF}$ and which sense the change in charge during a sampling time $T_S$ (charge amplifier) or current flow as a function of time (trans-impedance amplifier).

Figure 9:
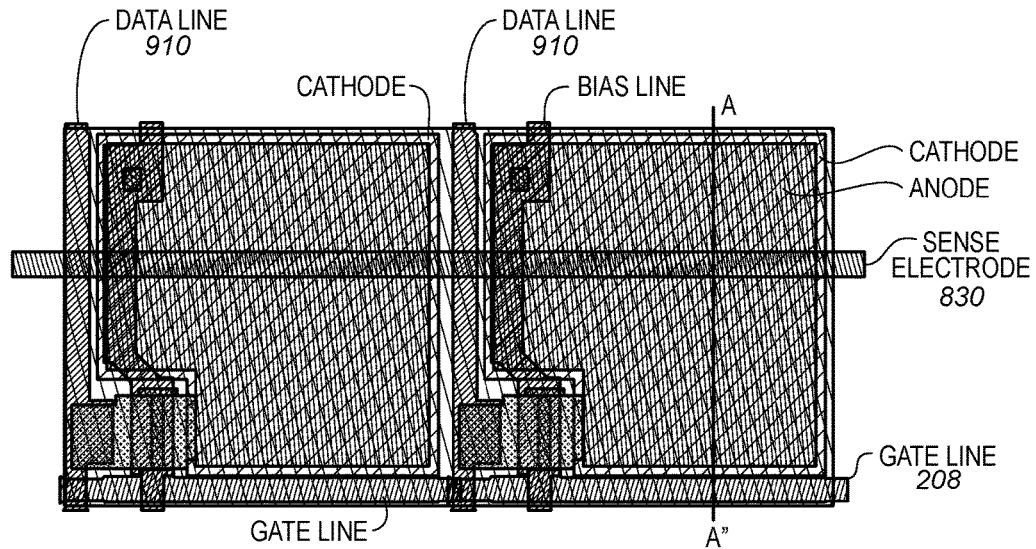
FIG. 9 illustrates an exemplary pixel layout having a sense electrode in gate electrode metal routed under the photodiodes parallel to the gate lines.
Figure 10:
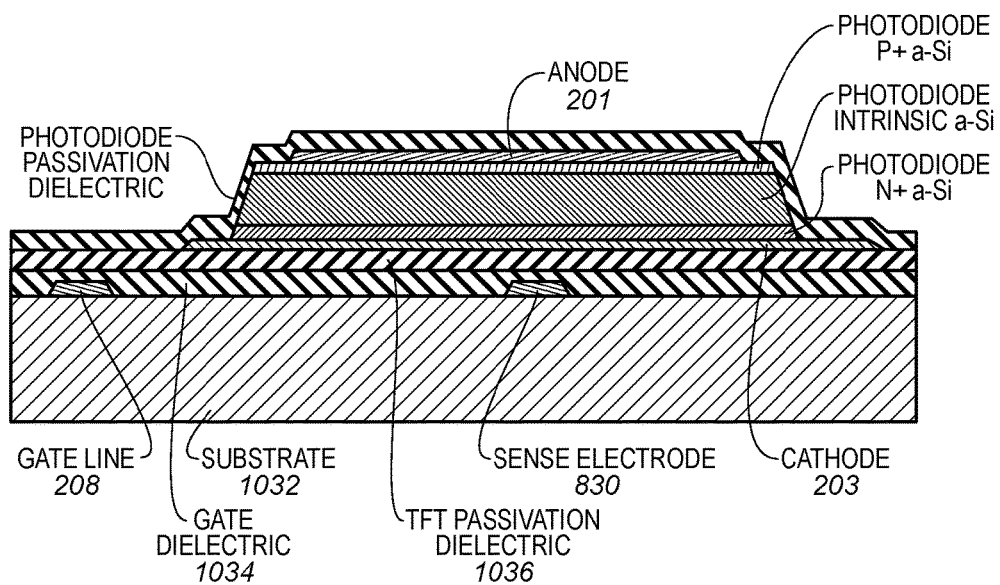
FIG. 10 is a cross-section of the pixel of FIG. 9 along the section line A-A".

One embodiment of an imaging array with a sense electrode, as shown in FIG. 8, is shown in the top view of FIG. 9 and in the cross section view of FIG. 10. In this exemplary embodiment no additional metal layers are required for fabrication of the array. As shown in FIGS. 9-10, a sense electrode 830 is patterned in the same metal layer as the gate line 208 and parallel to the gate line 208 between the substrate 1032 and the gate dielectric 1034. As shown in FIG. 10, the sense electrode is positioned under the photodiode cathode 203. The dielectric layers between the sense electrode and the cathode include the gate dielectric 1034 and TFT passivation dielectric 1036. The sense electrode capacitance would be given by $$C_S = \varepsilon \varepsilon_o L_{SE} W_{SE}/(t_{GD} + t_{PD})$$

Where $\varepsilon$ is the dielectric constant of the gate dielectric 1034 and TFT passivation dielectrics 1036, $\varepsilon_o$ is the free-space dielectric constant, $L_{SE}$ and $W_{SE}$ are the lengths and widths of the sense electrode under the cathode, respectively, and $t_{GD}+t_{PD}$ are the thicknesses of gate dielectric 1034 and passivation dielectrics 1036, respectively. For an exemplary pixel having dimensions of about 139 µm×139 µm, with $L_{SE}$=4 µm, $W_{SE}$=100 µm, $t_{GD}$ and $t_{PD}$ each about 400 nm of silicon nitride, the sense electrode capacitance per pixel would be about $C_S$=30 fF.

Additional pixel architectures with sense electrodes are possible. In one embodiment, shown in FIG. 11, a sense electrode 830 is shown in an orientation similar to that of FIG. 10 but with an additional isolation dielectric layer 1140 between the sense electrode 830 and the cathode 203. The additional dielectric layer 1140 can be used to reduce the sense capacitance value and also reduce capacitive loading of the data line 910.

Figure 12:
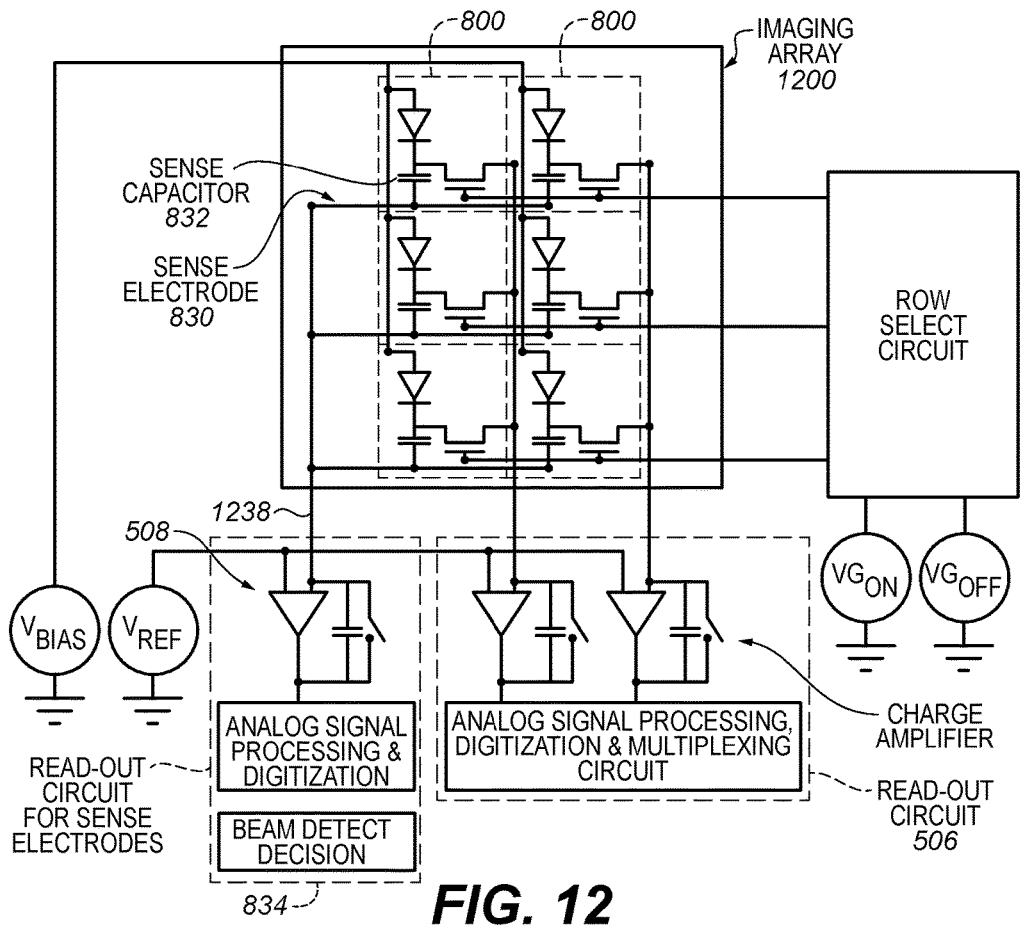
FIG. 12 illustrates an exemplary imaging array with circuitry for pixel electrode voltage sensing and beam detection.

FIG. 12 shows a 2×3 pixel region of an imaging array 1200 utilizing the sense electrode 830 and sense capacitor 832 in each pixel 800, as described above, wherein some components in the figure are not enumerated for ease of illustration but are described above. In comparison to the prior art array 500 of FIG. 5, the array 1200 of FIG. 12 comprises sense capacitors 832 attached between the photodiode cathode and sense electrodes 830. The sense electrodes 830 are routed to a sense circuit 834. FIG. 12 shows sense capacitors 832 connected to every pixel 800 in the array 1200, although in some circumstances it may be desirable to sample (sense) a portion of the pixels (photodiodes). In one embodiment, a sparse matrix of sense capacitors could be utilized. The sense circuit 834 shown in FIG. 12 comprises a charge amplifier 1208, although other sense circuits may be used. The current induced on the sense electrode $I_{SE}(t)$ from a single pixel 800 is $$I_{SE}(t)=(C_{CE}/C_{PD})\times(I_{DARK,i}+I_{\Phi,t}(t))$$

The total current induced on the sense electrode $I_{SE}(t)$ is the sum $\Sigma$ over the columns i and rows j of the current $I_{DARK,i}+I_{\Phi,t}(t)$ induced by the pixels adjacent to the dataline in each row:

$$I_{SE}(t)=(C_S/C_{PD})\times\Sigma\Sigma(I_{DARK,i,j}+I_{\Phi,i,j}(t))$$

The choice of the value of $C_S$ (sense capacitance) is a trade-off between having adequate current on the sense electrode 830 to detect the start and completion of X-ray exposure with good signal-to-noise ratio while minimizing the parasitic loading of the cathode. For example, if the sense capacitor 832 is 1% of the photodiode capacitance, then the current on the sense electrode would be $1\%\times\Sigma\Sigma(I_{DARK,i,j}+I_{\Phi,i,j}(t))$.

At the start of exposure $I_{\Phi,t}(t)$ will increase from zero to an approximately steady state value during the firing of the generator and at the end of exposure $I_{\Phi,t}(t)$ will decrease from its approximately steady-state value to zero. It can be seen that the start and stop of exposure could be determined if the charge induced on the sense electrode 830 by capacitive coupling of the cathodes of the photodiodes and that the charge vs. time can be monitored by the charge amplifier 508 used in the sense circuit 834. The charge amplifier 508 will sense a charge given by the integral over the sampling window of the charge amplifier 508:

$$Q_S=(C_S/C_{PD})\int\Sigma\Sigma I_{DARK,i,j}+I_{\Phi,i,j}(t)dt$$

Figure 6:
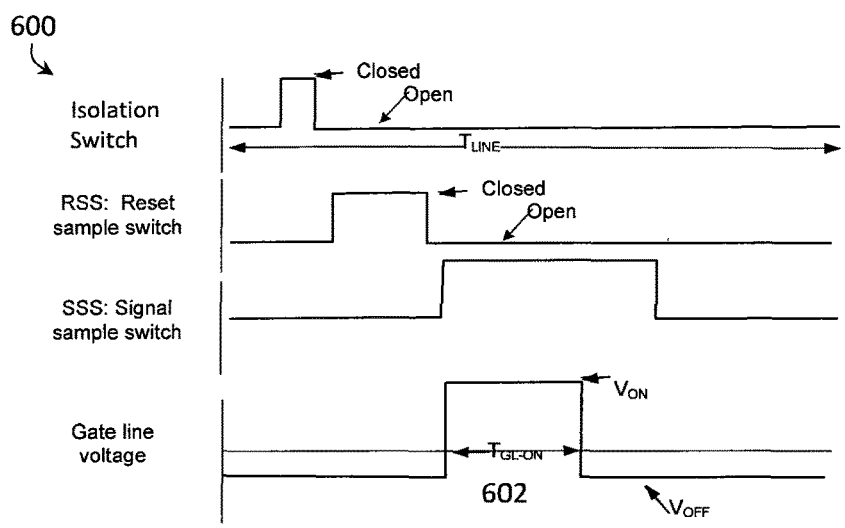
FIG. 6 illustrates exemplary timing during signal charge sensing.

We consider an embodiment in which the sense circuit 834 is operated with timing similar to the read-out circuit 506, described above. In this case the charge on the sense electrode 830 is sampled for a portion of a line time (see FIG. 6). Radiographic exposures can have a wide range in entrance exposure to the detector and in the exposure time. Table 1, below, shows two exemplary cases. The low exposure case (first column) is for a hand or neo-natal X-ray in which the beam is collimated. The minimum current (2nd last column) on the sense line 1238, determined for the example above, is 1.77 nA. If the sense line current was sampled with a charge amplifier 508 with a 30 µs sampling time, the minimum charge (last column) would be about 100,000 electrons.

TABLE 1

Sense line current and charge on ROIC feedback capacitor in 30 us sampling time

| Exposure Condition | Example | Beam | Exposure Area cm2 | Exposure mR | Exposure Time Min ms | Exposure Time Max ms | Sense line current Min nA | Sense line current Max nA | Charge in 30 us Min 1 KElec | Charge in 30 us Max 1 KElec |
|---|---|---|---|---|---|---|---|---|---|---|
| Low | Hand* | RQA3 | 100 | 0.01 | 2 | 10 | 1.77 | 8.84 | 100 | 500 |
| High | Chest | RQA7 | 1,505 | 2.5 | 25 | 200 | 94.3 | 2,194 | 17,700 | 411,000 |

In the embodiment of FIGS. 8-10 the sense electrode 830 is patterned in the same metal layer as is used for the row select 208 (gate metal). This places limitations on the routing of the sense electrode 830, since the sense electrode 830 cannot connect to the row select lines (gate lines). In this embodiment the sense electrodes 830 would comprise a single trace of metal under each row routed parallel to the row select electrode (gate metal) 208. Since the resistance of the sense line 830 is proportional to the length times the width, the sense line 830 would have high resistance as compared to a grid or sheet. In addition, since each sense electrode 830 must cross each of the data lines 910, the capacitance of the datalines would increase by the number of rows times the overlap capacitance between sense electrode 830 and dataline 910 (approximately 8 fF per pixel times about 3,072 rows or about 25 pF). A typical value for the total data line capacitance is about 120 pF, so the increase is about 20%. Since the thermal noise of the dataline 910 is proportional to its capacitance and is typically the largest noise source in a passive-pixel array, the increase in noise may be undesirable.

Figure 11:
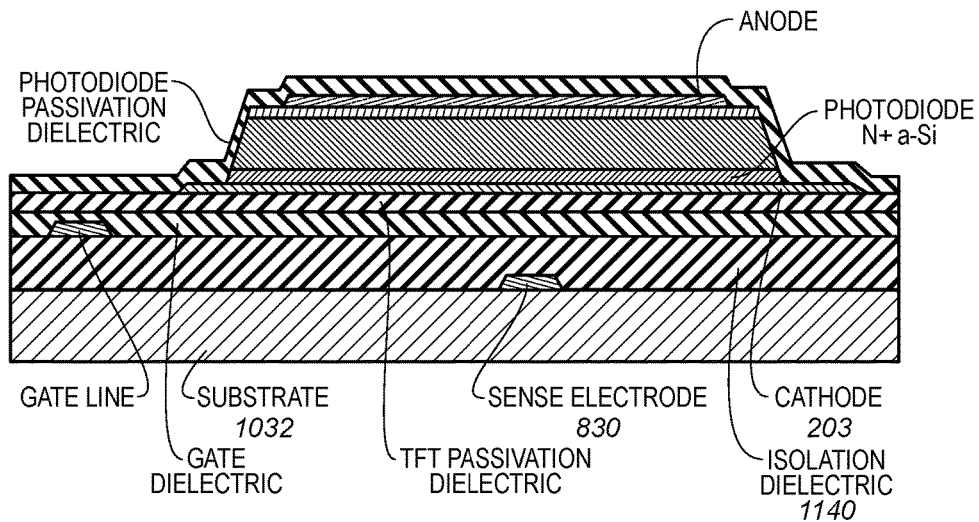
FIG. 11 illustrates an exemplary imaging array with sense electrode and additional isolation dielectric.

A second pixel embodiment that addresses these limitations is shown in FIG. 11, which is similar in most respects to the embodiment as described above in FIG. 10. In this embodiment the sense electrode 830 is fabricated in a separate layer of conductor positioned between the substrate 1032 and the remaining conductive traces in the array and separated by dielectric layers. This allows greater choice of routing geometry, including a grid geometry, a single sheet, or a geometry which allows separate regions of interest to form separate regions for sensing. The array of FIG. 11 also allows a greater total dielectric thickness between sense electrode 830 and the dataline 910, reducing the impact of the sense electrode 830 on dataline capacitance and thereby on detector noise. Finally, the array of FIG. 11 allows independent optimization of capacitance $C_{PE-SE}$ between pixel electrode 203 (photodiode cathode) and sense electrode 830 by design choice of the thickness of the isolation dielectric 1140 and/or the width of the sense electrode 830.

Figure 13:
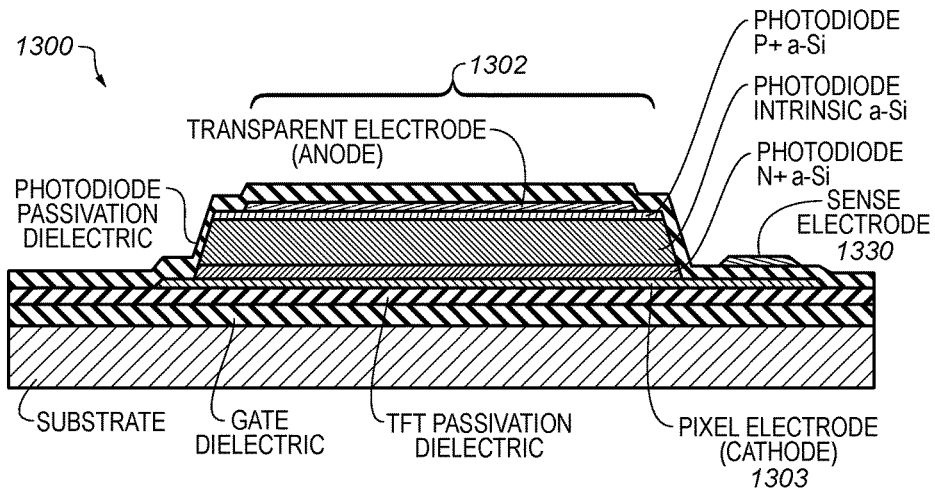
FIG. 13 illustrates an exemplary pixel cross section with sense electrode formed adjacent to the photodiode.

A third embodiment that also addresses these limitations is shown in FIG. 13. In this embodiment a sense electrode 1330 is fabricated adjacent to the photodiode 1302 in the pixel 1300. One terminal of the sense electrode 1330 is connected to a sense capacitor which, in turn, is connected to the pixel electrode 1303 and the second terminal of the sense electrode 1330 is connected to a sense-line, as described above in the example of FIG. 12, which is routed to the perimeter of the panels to connect the capacitors to a sense amplifier and beam detection subsystem (such as 834 of FIG. 12).

Figure 7:
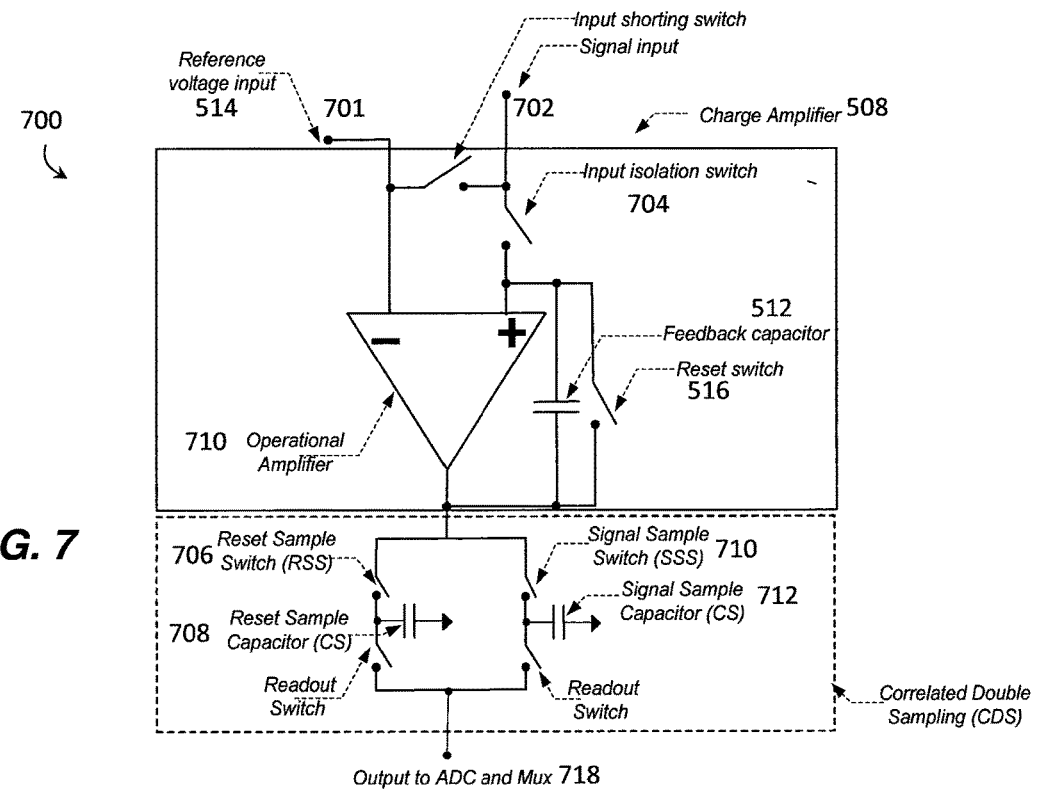
FIG. 7 illustrates an exemplary charge amplifier with sampling circuit.
Figure 14:
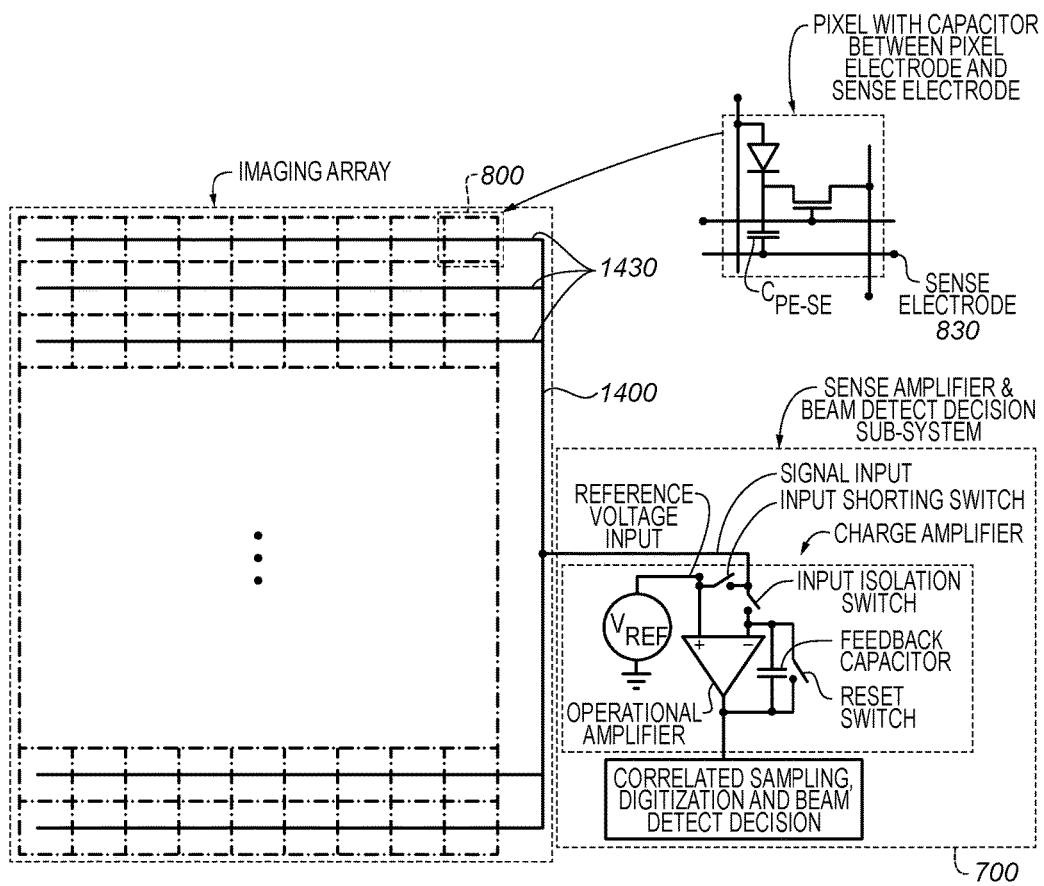
FIG. 14 illustrates an imaging array with single sense electrode.
Figure 15:
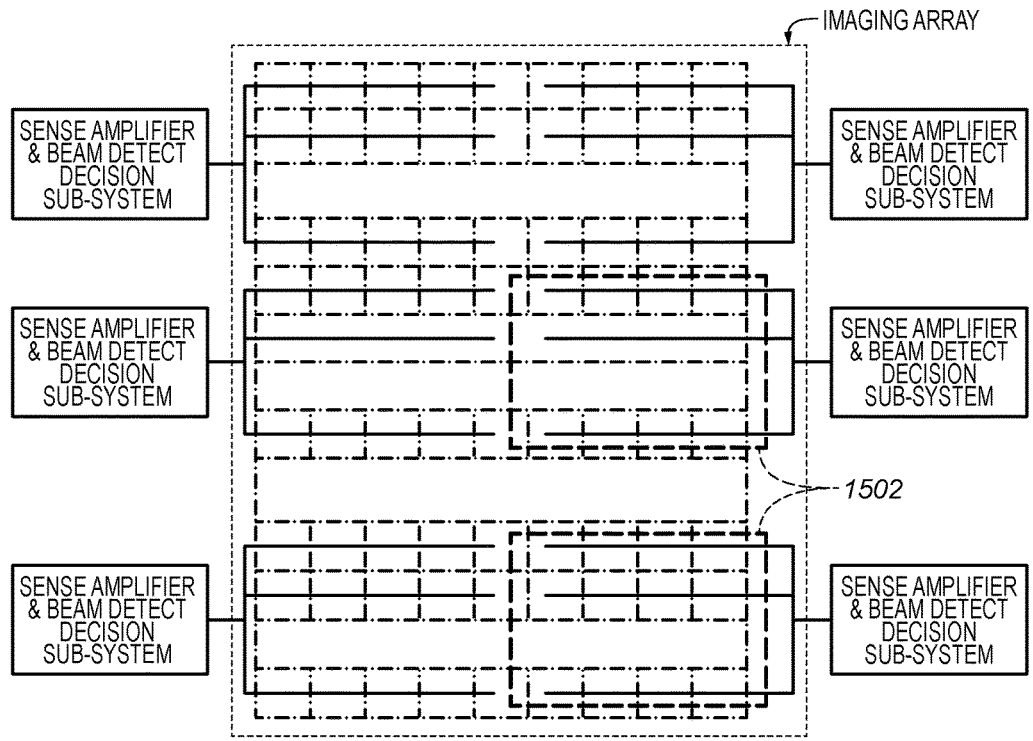
FIG. 15 illustrates an imaging array with sense electrodes grouped into regions of interest within the array.

Several options are possible for routing of the sense electrodes in the embodiments of FIGS. 10, 11, 13. The sense electrodes may be connected together to form a single sense plane 1400 and connected to a single sense amplifier and beam detection system 700 (FIG. 7), as illustrated in FIG. 14. The sense electrodes 1430 may be divided so that one portion (column) of the array is routed to one sense amplifier and beam detection system, as illustrated in FIG. 12. The sense electrodes may be further divided to form regions of interest (ROI) 1502 within the array, as illustrated in FIG. 15. Groupings into regions of interest 1502 may improve signal to noise for beam detection in many X-ray modalities. For example, in a chest X-ray, the perimeter of the array outside the skin line would receive an unobstructed dose of the X-ray beam and would have high signal; a ROI 1502 in that region would have high signal but, because of the smaller capacitance, it would have faster response time and lower noise. In another example, an X-ray of an extremity, such as a hand, would likely be limited to exposure just in the center of the array where the hand was positioned. In such a case, having a ROI 1502 in the central region of the array may have higher signal-to-noise ratio than having a single sense electrode covering the entire array.

Sense Plane Located Below Detector Substrate

Figure 16:
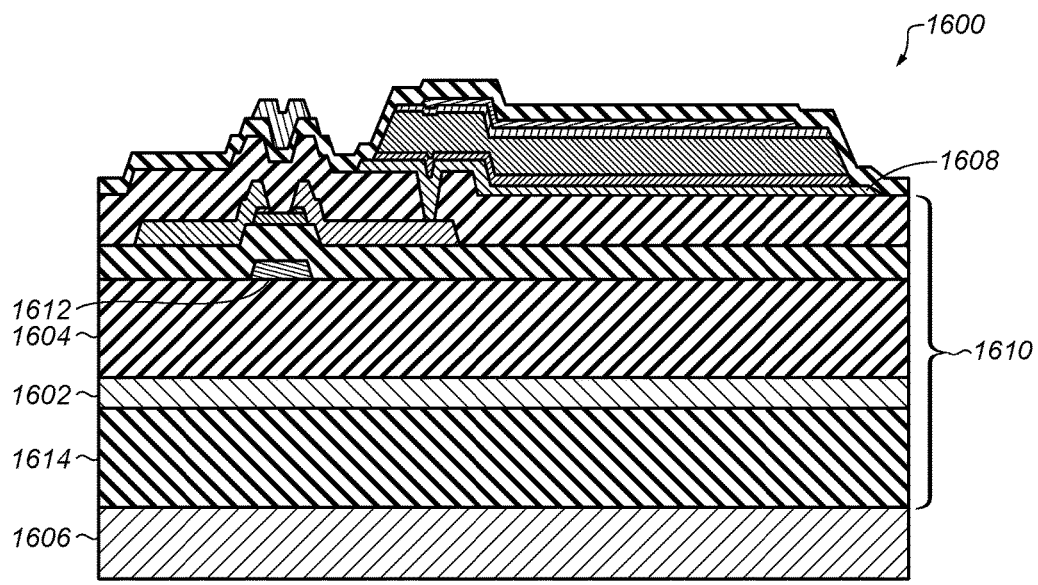
FIG. 16 illustrates a sense electrode formed between the array substrate and an electrical ground plane.

In one embodiment, an array with beam sensing 1600 is illustrated in FIG. 16. In this embodiment one or more sense electrodes 1602 are positioned between the imaging array substrate 1604 and an electrical ground plane 1606. The imaging array substrate 1604 is a dielectric, such as glass or plastic. Glass substrates for TFT fabrication are typically 500 μm to 1 mm thick. Imaging arrays have also been fabricated on plastic substrates or transferred to plastic substrates. These are typically 10 μm to 100 μm thick. As compared to the sense electrode of FIG. 10, the sense plane 1602 of FIG. 16 has two disadvantages: (1) because of the greater thickness of the dielectric 1610 between the pixel electrode 1608 and the sense plane 1602, the capacitance between pixel electrode 1608 and sense plane 1602 in FIG. 16 is lower than that of FIG. 10 and (2) because the sense plane 1602 of FIG. 16 underlies both the pixel electrodes 1608 and the gate lines 1612, it is subject to feed-through charge induced by the transition of gate lines 1612 from one voltage to another during array readout.

The sense plane embodiment offers the advantage of not requiring additional circuits to be added to the prior-art detector array. The sense electrodes 1602 may be fabricated using thin-film metal layers, such as deposited or coated thin films of Indium Tin oxide (ITO) or Indium Gallium Zinc Oxide (IGZO). Alternatively, they may be metal foil. A second dielectric 1614 may be positioned between the sense plane and a ground plane 1606. In a radiographic detector, the ground plane 1606 is typically the mechanical plate upon which the detector is mounted. The thickness of the second dielectric 1614 is a compromise between the capacitance between the sense electrode 1602 and ground 1606, which impacts signal-to-noise ratio and the physical thickness of the assembly of FIG. 16.

Figure 17:
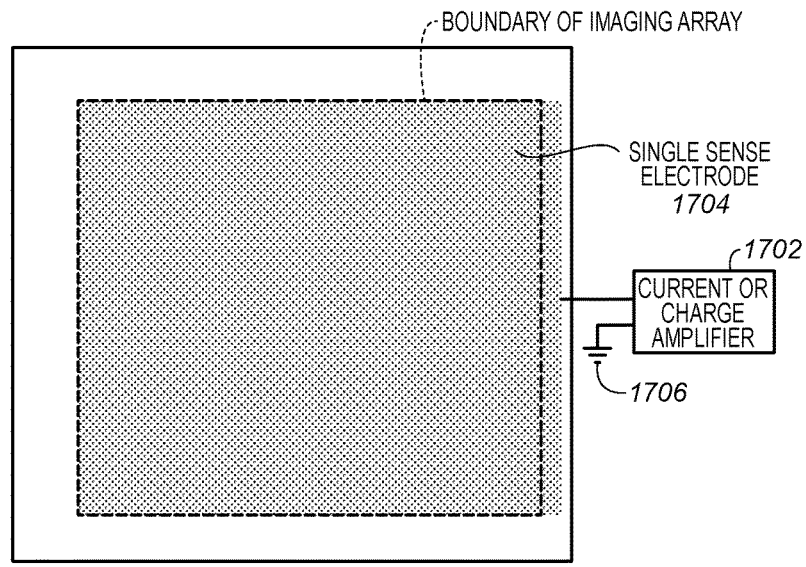
FIG. 17 illustrates a single sense plane pixel configuration.
Figure 18:
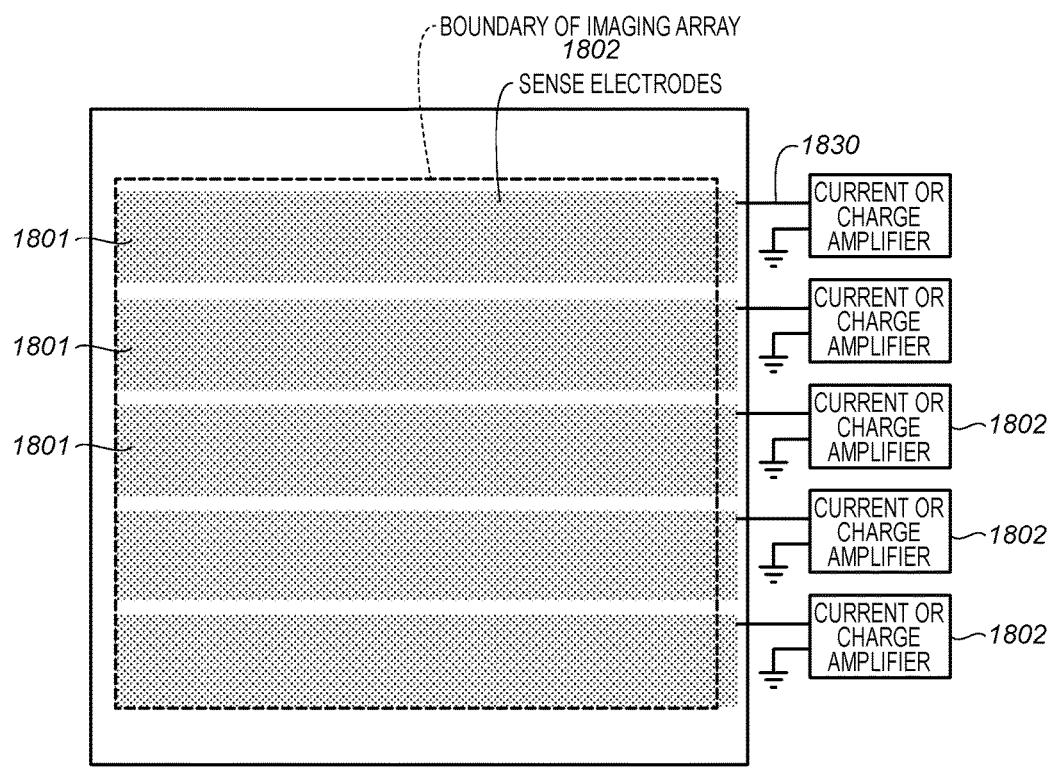
FIG. 18 illustrates a multiple sense plane pixel configuration.

Various configurations of the sense plane can be chosen based on a variety of considerations, including optimization of response time and signal-to-noise ratio. In one embodiment, a configuration in which a single sense plane underlies the entire detector array is illustrated in FIG. 17. In this embodiment, a current or charge amplifier 1702 may be connected between the sense electrode 1704 and electrical ground 1706 (or any bias supply connected to system ground). A configuration in which multiple sense planes 1801, each underlying a separate region of the imaging array 1802, is shown in FIG. 18. In this case the current or charge induced on each electrode 1830 is monitored with a charge or current amplifier 1802 for that electrode (or alternatively, a single amplifier multiplexed among the electrodes). Other configurations of the multiple electrode embodiment could be designed based on the use cases anticipated for the detector.

As will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.), or an embodiment combining software and hardware aspects that may all generally be referred to herein as a "service," "circuit," "circuitry," "module," and/or "processing system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Program code and/or executable instructions embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer (device), partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Computer program instructions may be provided to a processor of a general purpose computer, special purpose computer, such as an image processor or other programmable data processing apparatus to produce a machine, such that the instructions, which execute via the processor of the computer or other programmable data processing apparatus, create means for implementing the functions/acts specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions and acts specified herein.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A radiographic energy detecting pixel circuit comprising:
   a photosensor for generating charges in response to photons impacting the photosensor;
   a data line;
   a controllable switching device electrically connected to the photosensor and to the data line for selectively transmitting charges from the photosensor to the data line;
   a sensing circuit electrically connected to the photosensor to measure a rate of charge generation in the photosensor,
   wherein the photosensor comprises a photodiode, the switching device comprises a TFT, one terminal of the photosensor comprises a cathode, the TFT and the sensing circuit are electrically connected to the cathode, the cathode is further electrically connected to a drain terminal of the TFT, another terminal of the photosensor comprises an anode, and wherein the anode is electrically connected to a bias voltage supply; and
a sensing capacitor electrically connected between the cathode and the sensing circuit.

2. The pixel circuit of claim 1, wherein the sensing circuit comprises a current sensing circuit or a charge sensing circuit to measure a change in charge or current over time.

3. The pixel circuit of claim 2, wherein the sensing circuit measures a change in an amount of charge generated in the photosensor.

4. The pixel circuit of claim 3, wherein the sensing circuit comprises an operational amplifier, a feedback capacitor electrically connecting an output and an input of the operational amplifier, the sensing capacitor is electrically connected to the feedback capacitor, and wherein the sensing circuit transmits a signal when a rate of charge varying over time as detected by the sensing circuit exceeds a threshold.

5. The pixel circuit of claim 3, wherein the sensing circuit transmits a signal when an amount of current generated by accumulating charges varies over time beyond a threshold.

6. A radiographic detector comprising:
   a substrate;
   a plurality of dielectric layers over the substrate;
   an array of photosensors formed in a device layer over the dielectric layers for generating charges in response to photons impacting the photosensors, each of the photosensors comprising an anode, a cathode, and a charge collecting layer therebetween;
   a data line formed over the substrate substantially parallel to and adjacent to a first side of a first portion of the photosensors;
   a gate line formed over the substrate, under a first one of the dielectric layers, over a second one of the dielectric layers, and substantially parallel to a second side of a second portion of the photosensors different from the first portion of the photosensors and perpendicular to the data line;
   a switching device formed over the gate line, the switching device for selectively electrically connecting the cathode to the data line under control of the gate line; and
   a sense electrode formed over the substrate and under the photosensor, the sense electrode separated from the photosensor by the first one and the second one of the dielectric layers, and
   wherein the sense electrode is electrically linked to the photosensor by a capacitance therebetween, and wherein the sense electrode is formed under the first one and the second one of the dielectric layers.

7. A radiographic detector comprising:
   a substrate;
   a plurality of dielectric layers over the substrate;
   an array of photosensors formed in a device layer over the dielectric layers for generating charges in response to photons impacting the photosensors, each of the photosensors comprising an anode, a cathode, and a charge collecting layer therebetween;
   a data line formed over the substrate substantially parallel to and adjacent to a first side of a first portion of the photosensors;
   a gate line formed over the substrate and under one of the dielectric layers substantially parallel to a second side of a second portion of the photosensors different from the first portion of the photosensors and perpendicular to the data line;
   a switching device formed over the gate line, the switching device for selectively electrically connecting the cathode to the data line under control of the gate line; and a sense electrode formed over the substrate and under the photosensor, the sense electrode separated from the photosensor by one or more of the dielectric layers, wherein the sense electrode is electrically linked to the photosensor by a capacitance therebetween, the gate line and the sense electrode are formed under a common dielectric layer, the sense electrode is disposed under the second portion of the photosensors different from the first portion of the photosensors, the photosensors each comprise a photodiode, one terminal of the photodiodes each comprise a cathode, another terminal of the photodiodes each comprise an anode, the capacitance links the cathode to the sense electrode, a bias voltage supply is electrically connected to the anodes, and wherein the sense electrode is electrically connected to a sensing circuit comprising a current sensing circuit or a charge sensing circuit to measure a rate of charge generation over time in the photosensor.

8. The detector of claim 7, wherein the sensing circuit transmits a signal when the rate of charge generation varies over time beyond a threshold.

* * * * *